United States Patent
Maung et al.

(10) Patent No.: US 10,657,090 B2
(45) Date of Patent: *May 19, 2020

(54) EMBEDDED UNIVERSAL SERIAL BUS 2 REPEATER

(71) Applicant: TEXAS INSTRUMENTS INCORPORATED, Dallas, TX (US)

(72) Inventors: Win Naing Maung, Plano, TX (US); Bhupendra Sharma, Bangalore (IN); Huanzhang Huang, Plano, TX (US); Douglas Edward Wente, Murphy, TX (US); Suzanne Mary Vining, Plano, TX (US); Mustafa Ulvi Erdogan, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/716,891

(22) Filed: Dec. 17, 2019

(65) Prior Publication Data

US 2020/0125517 A1 Apr. 23, 2020

Related U.S. Application Data

(63) Continuation of application No. 16/404,433, filed on May 6, 2019.

(60) Provisional application No. 62/715,326, filed on Aug. 7, 2018, provisional application No. 62/714,250, filed (Continued)

(51) Int. Cl.
*H03K 5/24* (2006.01)
*G06F 13/38* (2006.01)
*H03F 3/45* (2006.01)
*G06F 13/42* (2006.01)

(52) U.S. Cl.
CPC ........ *G06F 13/382* (2013.01); *G06F 13/4282* (2013.01); *H03F 3/45475* (2013.01); *H03K 5/24* (2013.01); *G06F 2213/0042* (2013.01)

(58) Field of Classification Search
CPC .......... H03F 1/0205; H04B 3/36; H04L 25/24
See application file for complete search history.

(56) References Cited

U.S. PATENT DOCUMENTS 7,400,173 B1 7/2008 Kwong et al.
7,443,211 B2 10/2008 Liu
8,332,563 B2 12/2012 Sobelman
(Continued)

OTHER PUBLICATIONS

International Search Report in corresponding PCT Application No. PCT/US2019/047877, dated Nov. 21, 2019 (2 pages).
(Continued)

*Primary Examiner* — David S Huang
(74) *Attorney, Agent, or Firm* — John R. Pessetto; Charles A. Brill; Frank D. Cimino

(57) ABSTRACT

Aspects of the disclosure provide for a method. In at least some examples, the method includes receiving, at a circuit, data via a differential input signal. The method further includes detecting a falling edge in the data received via the differential input signal. The method further includes holding an output of the circuit at a final logical value of the data. The method further includes disabling a transmitter of the circuit while holding the output of the circuit at the final logical value of the data. The method further includes releasing the output of the circuit from the final logical value of the data.

1 Claim, 4 Drawing Sheets

US 10,657,090 B2
Page 2

Related U.S. Application Data on Aug. 3, 2018, provisional application No. 62/711,824, filed on Jul. 30, 2018.

(56) References Cited

U.S. PATENT DOCUMENTS

| | | | |
|---|---|---|---|
| 9,130,817 | B2 | 9/2015 | Yang |
| 10,333,473 | B1* | 6/2019 | Shen ..................... H03F 1/0205 |
| 2015/0227489 | A1* | 8/2015 | Chen ..................... G06F 13/385 |
| | | | 710/313 |
| 2016/0162427 | A1 | 6/2016 | Kang et al. |
| 2016/0162430 | A1 | 6/2016 | Ma et al. |
| 2016/0380747 | A1 | 12/2016 | Low et al. |
| 2018/0173666 | A1 | 6/2018 | Srivastava |
| 2019/0288743 | A1 | 9/2019 | Wang et al. |

OTHER PUBLICATIONS

Compaq Computer Corporation et al., "Universal Serial Bus Specification," Revision 2.0, Apr. 27, 2000, 650 p., in 9 parts. [Online: https://www.usb.org/document-library/usb-20-specification].

Compaq Computer Corporation, "USB 2.0 Adopters Agreement," Apr. 14, 2011, 6 p. [Online: https://www.usb.org/document-library/usb-20-specification].

Compaq Comuter Corporation et al., "Errata for 'USB Revision 2.0 Apr. 27, 2000' as of Dec. 7, 2000," 31 p. [Online: https://www.usb.org/document-library/usb-20-specification].

Compaq Comuter Corporation et al., "USB 2.0 Specification Engineering Change Notice (ECN) #1: Mini-B Connector," Oct. 20, 2000, 45 p. [Online: https://www.usb.org/document-library/usb-20-specification].

Compaq Computer Corporation et al., "Pull-Up/Pull-Down Resistors," USB Engineering Change Notice, 5 p. [Online: https://www.usb.org/document-library/usb-20-specification].

Compaq Computer Corporation et al., "Errata for 'USB Revision 2.0 Apr. 27, 2000' as of May 28, 2002," 7 p. [Online: https://www.usb.org/document-library/usb-20-specification].

Compaq Computer Corporation et al., "Interface Association Descriptors," USB Engineering Change Notice, 5 p. [Online: https://www.usb.org/document-library/usb-20-specification].

Compaq Computer Corporation et al., "Rounded Chamfer," Engineering Change Notice, Oct. 8, 2003, 3 p. [Online: https://www.usb.org/document-library/usb-20-specification].

Compaq Computer Corporation et al., "Unicode UTF-16LE for String Descriptors," USB Engineering change Notice, Feb. 21, 2005, 2 p. [Online: https://www.usb.org/document-library/usb-20-specification].

Compaq Computer Corporation et al., "Inter-Chip USB Supplement to the USB 2.0 Specification," Revision 1.0, Mar. 13, 2006, 48 p. [Online: https://www.usb.org/document-library/usb-20-specification].

Compaq Computer Corporation et al., "Device Class Specification Adopters Agreement," Apr. 4, 2007, 5 p. [Online: https://www.usb.org/document-library/usb-20-specification].

Compaq Computer Corportion et al., "USB 2.0 Link Power Management Addendum," Engineering Change Notice, Jul. 16, 2007, 29 p. [Online: https://www.usb.org/document-library/usb-20-specification].

Compaq Computer Corporation et al., "High-Speed Inter-Chip USB Electrical Specification," Version 1.0, Sep. 23, 2007, 16 p. [Online: https://www.usb.org/document-library/usb-20-specification].

Compaq Computer Corporation et al., "Suspend Current Limit Changes," USB Engineering Change Notice, Apr. 9, 2008, 2 p. [Online: https://www.usb.org/document-library/usb-20-specification].

Compaq Computer Corporation et al., "5V Short Circuit Withstand Requirement Change," USB Engineering Change Notice, Dec. 22, 2008, 2 p. [Online: https://www.usb.org/document-library/usb-20-specification].

Compaq Computer Corporation et al., "Device Capacitance," USB Engineering Change Notice, Dec. 22, 2008, 2 p. [Online: https://www.usb.org/document-library/usb-20-specification].

Compaq Computer Corporation et al., "Material Change," USB Engineering Change Notice, Dec. 22, 2008, 3 p. [Online: https://www.usb.org/document-library/usb-20-specification].

Compaq Computer Corporation et al., "USB 2.0 Phase-Locked SOFs," USB Engineering Change Notice, Dec. 22, 2008, 2 p. [Online: https://www.usb.org/document-library/usb-20-specification].

Compaq Computer Corporation et al., "USB 2.0 DC Resistance," USB Engineering Change Notice, Dec. 22, 2008, 8 p. [Online: https://www.usb.org/document-library/usb-20-specification].

Compaq Computer Corporation et al., An Examination of the Effect of Power to Signal & of Signal to Power (Supplement for XV-4687C), Dec. 2, 2009, 15 p. [Online: https://www.usb.org/document-library/usb-20-specification].

Compaq Computer Corporation et al., "Clarification on the Chamfer on USB 2.0 Micro Connectors," USB Engineering Change Notice, Mar. 23, 2010, 4 p. [Online: https://www.usb.org/document-library/usb-20-specification].

Compaq Computer Corporation et al., "Maximum Un-Mating Force Value Definition to Micro Connector USB 2.0," Mar. 23, 2010, 3 p. [Online: https://www.usb.org/document-library/usb-20-specification].

Compaq Computer Corporation et al., "'On-The-Go Supplement to the USB 2.0 Specification' Adopters Agreement," May 26, 2009, 1 p. [Online: https://www.usb.org/document-library/usb-20-specification].

Compaq Computer Corporation et al., "USB Test_Mode Selector Values," USB Engineering Change Notice, Jul. 26, 2010, 3 p. [Online: https://www.usb.org/document-library/usb-20-specification].

Compaq Computer Corporation et al., "Errata for USB 2.0 ECN: Link Power Management (LPM)—Jul. 2007," Sep. 28, 2011, 8 p. [Online: https://www.usb.org/document-library/usb-20-specification].

Compaq Computer Corporation et al., "On-The-Go and Embedded Host Supplement to the USB Revision 2.0 Specification," Revision 2.0 version 1.1a, Jul. 27, 2012, 96 p., in 2 parts. [Online: https://www.usb.org/document-library/usb-20-specification].

Compaq Computer Corporation et al., "HSIC ECN," USB Engineering Change Notice, May 21, 2012, 6 p. [Online: https://www.usb.org/document-library/usb-20-specification].

Compaq Computer Corporation et al., USB 2.0 Connect Timing Update, USB Engineering Change Notice, Apr. 4, 2013, 6 p. [Online: https://www.usb.org/document-library/usb-20-specification].

Compaq Computer Corporation et al., "Disconnect Supplement to High Speed Inter Chip Specification," Revision 1.0, Sep. 18, 2013, 8 p. [Online: https://www.usb.org/document-library/usb-20-specification].

Compaq Computer Corporation et al., "USB 2.0 VBUS Max Limit," Aug. 11, 2014, 5 p. [Online: https://www.usb.org/document-library/usb-20-specification].

Compaq Computer Corporation et al., "Maximum Vbus Voltage," Nov. 26, 2014, 4 p. [Online: https://www.usb.org/document-library/usb-20-specification].

"Quad Type Cable Additional for Micro USB," 3 p.

"MicroUSB Micro-B ID Pin Resistance and Tolerance Stack-Up between D+ and D−," USB Engineering Change Notice, 2 p.

Compaq Computer Corporation et al., Universal Serial Bus Micro-USB Cables and Connectors Specification, Revision 1.01, Apr. 4, 2007, 36 p.

Fujikura Ltd., "ECN Proposal for Micro-USB Cables," Aug. 15, 2008, 23 p.

Compaq Computer Corporation et al., "On-The-Go and Embedded Host Supplement to the USB Revision 2.0 Specification," Revision 2.0, version 1.1a, Jul. 27, 2012, 96 p., in 2 parts.

Apple Inc. et al., Embedded USB2 (eUSB2) Physical Layer Supplement to the USB Revision 2.0 Specification, Revision 1.1, Copyright 2018 Apple Inc. et al., 164 p., in 2 parts.

International Search Report in corresponding PCT Application No. PCT/US2019/045326, dated Oct. 24, 2019 (2 pages).

International Search Report in corresponding PCT Application No. PCT/US2019/043334, dated Feb. 27, 2020 (2 pages).

* cited by examiner

EMBEDDED UNIVERSAL SERIAL BUS 2 REPEATER

CROSS-REFERENCE TO RELATED APPLICATIONS

This continuation application claims priority to U.S. patent application Ser. No. 16/404,433, filed May 6, 2019, which claims priority to U.S. Provisional Patent Application No. 62/711,824, filed Jul. 30, 2018, and U.S. Provisional Patent Application No. 62/714,250, filed Aug. 3, 2018, and U.S. Provisional Patent Application No. 62/715,326, filed Aug. 7, 2018, all of which are hereby incorporated herein by reference in their entirety.

SUMMARY

Other aspects of the disclosure provide for a circuit. In at least some examples, the circuit includes a first amplifier, a second amplifier, a third amplifier, a first resistor, a second resistor, a first comparator, a bus holder circuit, and a logic circuit. The first amplifier has a first input coupled to a first node, a second input coupled to a second node, a first output, and a second output. The second amplifier has a first input coupled to the first output of the first amplifier, a second input coupled to the second output of the first amplifier, a first output coupled to a third node, and a second output coupled to a fourth node. The third amplifier has a first input coupled to the third node, a second input coupled to the fourth node, a first output coupled to a fifth node, a second output coupled to a sixth node, and a control input. The first resistor is coupled between the first node and a seventh node. The second resistor is coupled between the seventh node and the second node. The first comparator has a first input coupled to the seventh node, a second input coupled to an eighth node, and an output. The bus holder circuit has an input, a first output coupled to the third node, and a second output coupled to the fourth node. The logic circuit has a first input coupled to the output of the first comparator, a first output coupled to the input of the bus holder circuit, and a second output coupled to the control input of the third amplifier.

Other aspects of the disclosure provide for a system. In at least some examples, the system includes a processing element and an embedded Universal Serial Bus (USB) (eUSB2) repeater. The processing element is configured to communicate according to an eUSB2 protocol. The eUSB2 repeater is coupled to the processing element, and includes a first amplifier, a second amplifier, a third amplifier, a first resistor, a second resistor, a first comparator, a bus holder circuit, and a logic circuit. The first amplifier has a first input coupled to a first node, a second input coupled to a second node, a first output, and a second output. The second amplifier has a first input coupled to the first output of the first amplifier, a second input coupled to the second output of the first amplifier, a first output coupled to a third node, and a second output coupled to a fourth node. The third amplifier has a first input coupled to the third node, a second input coupled to the fourth node, a first output coupled to a fifth node, a second output coupled to a sixth node, and a control input. The first resistor is coupled between the first node and a seventh node. The second resistor is coupled between the seventh node and the second node. The first comparator has a first input coupled to the seventh node, a second input coupled to an eighth node, and an output. The bus holder circuit has an input, a first output coupled to the third node, and a second output coupled to the fourth node. The logic circuit has a first input coupled to the output of the first comparator, a first output coupled to the input of the bus holder circuit, and a second output coupled to the control input of the third amplifier.

Other aspects of the disclosure provide for a method. In at least some examples, the method includes receiving, at a circuit, data via a differential input signal. The method further includes detecting a falling edge in the data received via the differential input signal. The method further includes holding an output of the circuit at a final logical value of the data. The method further includes disabling a transmitter of the circuit while holding the output of the circuit at the final logical value of the data. The method further includes releasing the output of the circuit from the final logical value of the data.

BRIEF DESCRIPTION OF THE DRAWINGS

For a detailed description of various examples, reference will now be made to the accompanying drawings in which.

DETAILED DESCRIPTION

Figure 1:
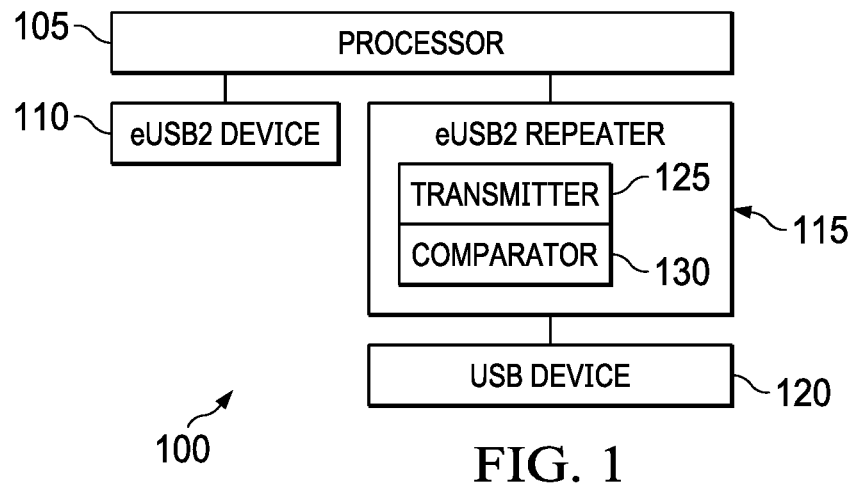
FIG. 1 shows a block diagram of an illustrative system in accordance with various examples.

Universal Serial Bus (USB) is a standard establishing specifications for interconnect cabling, connectors, and communication protocols. As referred to herein, USB refers to any version of the USB specification, including any amendments or supplements, certified by the USB Implementers Forum (USB IF) or any suitable body who replaces and/or aids the USB IF in its role overseeing the USB specification, whether now existing or later developed. In at least one example, USB, as referred to herein, encompasses any one or more of the USB 1.0 specification, USB 2.0 specification, USB 3.0 specification, USB 4.0 specification, or any derivatives thereof, such as amended or ".x" variations of the above specifications. Also, as referred to herein, legacy USB refers to USB 2.x and/or USB 1.x. Embedded USB (eUSB), in at least some examples, refers to eUSB2. While reference is made herein to eUSB2, in various examples the teachings of the present disclosure are further applicable to other versions of eUSB that are extensions of, alternatives to, derivatives of, or otherwise share at least some commonalities with, or similarities to, eUSB2. Accordingly, while eUSB2 is referred to herein in an exemplary manner, the present disclosure is, in some examples, not limited to implementation in an eUSB2 environment, in an eUSB environment, or in a USB environment.

At its inception, USB was primarily intended for implementation in specifying standards for connection and communication between personal computers and peripheral devices. However, as adoption of the USB standard has expanded and implementation in computing devices of support for the USB standard has gained in popularity, efforts have been made to extend and expand the applicability of USB. For example, while initially establishing specifications for communications between personal computers and peripheral devices, USB has expanded to communication between peripheral devices, between personal computers, and other use cases. As a result of such widespread implementation and use of USB, efforts are being further made to utilize USB as a communication protocol among individual subsystems or circuits (e.g., such as a system-on-a-chip (SoC)). Such implementations are sometimes referred to as eUSB2. New challenges arise in implementing eUSB2. For example, at a circuit level, computing devices often operate at voltage levels that vary from those of conventional USB, creating an impediment between direct communication between eUSB2 and legacy USB systems. To mitigate this impediment, an eUSB2 repeater operates as a bridge or non-linear redriver between eUSB2 and legacy USB systems, or vice versa, to translate between legacy USB signaling voltage levels that are customarily about 3.3 volts (V) and eUSB2 signaling voltages levels that are circuit-level (e.g., silicon appropriate voltages) such as about 1.0 V, 1.2 V, 1.4 V, or any other suitable value less than 3.3 V.

In some examples, a last bit of data of a USB packet (e.g., including control information, data to be transferred, and error detection and/or correction information), such as a last bit of an end of packet (EOP) indicator of the USB packet, becomes stretched, creating additional data bits following the end of the EOP indicator. The stretching is caused, in some examples, by hub switching skews in the USB communication. Following the end of the EOP indicator, eUSB2 input lines of the eUSB2 repeater go idle. If a transmitter of the eUSB2 repeater is not rapidly turned off following a transition of the end of the EOP indicator, the idle signal received on the eUSB2 differential input signal lines is passed through to USB differential output signal lines of the eUSB2 repeater and results in noise being sent to a device coupled to the USB differential output signal lines of the eUSB2 repeater, which in at least some implementations is undesirable and/or unacceptable. However, USB specification also prohibits truncating the EOP indicator, thereby limiting how quickly the transmitter of the eUSB2 repeater is turned off. This noise or bits following the transition of the end of the EOP indicator is, in some examples, referred to as dribble bits.

In some eUSB2 repeater implementations, a clock data recovery (CDR) circuit or a phase locked loop (PLL) determines clock timing information of a signal received by the eUSB2 repeater and, based on that clock timing information, the eUSB2 repeater counts a number of bits received and/or transmitted. For example, by using the CDR and/or PLL information, the eUSB2 repeater turns off the transmitter of the eUSB2 repeater once a particular number of bits of the EOP indicator have been received and/or transmitted, turning off the transmitter of the eUSB2 repeater prior to transmitting noise resulting from the idle eUSB2 input lines. However, both a CDR circuit and a PLL are comparatively large components of an eUSB2 repeater in terms of footprint (e.g., physical surface area of a component die) with respect to a remainder of the eUSB2 repeater, increasing both cost to manufacture the eUSB2 repeater and power consumed by the eUSB2 repeater. In at least some aspects, goals of implementation of eUSB2 include providing communication according to the USB specifications in smaller, lower-power environments than legacy USB, which runs contrary to the size and power requirements of both the CDR circuit and the PLL. Accordingly, in at least some eUSB2 repeater implementations it is desirable to perform EOP detection, with support for dribble bits, without using a CDR circuit or a PLL in either ingress or egress directions.

At least some aspects of the present disclosure provide for a circuit. The circuit is, in some examples, suitable for use in interfacing between eUSB2 and USB interfaces. Particularly, in at least some examples the circuit is an eUSB2 to USB repeater. In other examples, the circuit is a USB to eUSB2 repeater. For example, the circuit provides level-shifting from eUSB2 voltage levels to USB voltage levels and/or from USB voltage levels to eUSB2 voltage levels. As such, in at least some examples the circuit is viewed as a buffer and/or a level-shifter. In some examples, the circuit further provides support for one or more elements of USB communication, such as dribble bits and EOP information of varying widths (e.g., an about 8-bit EOP indicator, such as in low-speed communication, and/or an about 40-bit EOP indicator, such as in high-speed communication). For example, at an end of the EOP indicator, eUSB2 differential input signal lines of the circuit go idle (e.g., a differential voltage between the eUSB2 differential input signal lines falls below a threshold). When the end of the EOP indicator is not accurately identified by the circuit, noise resulting from the idle eUSB2 differential input signal lines is output by the circuit on the USB differential output signal lines, which in at least some implementations is undesirable and/or unacceptable for a particular application environment of the circuit. In at least some examples, the circuit includes one or more components configured to rapidly detect eUSB2 differential input signal lines of the circuit becoming idle. The detection, in at least some examples, is made based on a differential voltage of the eUSB2 differential input signal lines of the circuit falling below a threshold. In at least some examples, based on the detection, a logic component of the circuit controls one or more other components of the circuit to maintain a value of the last bit of the EOP indicator for up to four additional bits, corresponding to the four dribble bits permitted according to USB specification. In at least some examples, the present disclosure is extensible to accommodate a larger or smaller number of dribble bits permitted according to USB specification if the allowance of dribble bits provided for in the USB specification changes.

Maintaining the last bit of data of the EOP indicator causes a control signal for turning off transmission by the circuit to arrive prior to an end of transmission of the actual data of the last bit of the EOP indicator, even if transmission of an appropriate number of bits of the EOP indicator has already occurred. For example, if the EOP indicator is a series of logical high value bits, the circuit maintains a logical high value for up to four additional bits after the end of the EOP indicator and the eUSB2 differential input signal lines of the circuit going idle to prevent noise from being sent by the circuit on the USB differential output signal lines. Similarly, if the EOP indicator is a series of logical low value bits, the circuit maintains a logical low value for up to four additional bits after the end of the EOP indicator and the eUSB2 differential input signal lines of the circuit going idle to prevent noise from being sent by the circuit on the USB differential output signal lines. In at least some examples, a comparator is implemented in the circuit to determine when the eUSB2 differential input signal lines of the circuit go idle, providing a control signal to a logic component of the circuit for causing the last bit of the EOP indicator to be held for up to four additional bits following the end of the EOP indicator, preventing noise from being transmitted by the circuit following the transition at the end of the EOP indicator at a lower space and power cost than if the circuit implemented a CDR circuit and/or a PLL.

Turning now to FIG. 1, a block diagram of an illustrative system 100 is shown. In at least some examples, the system 100 is illustrative of a computing device, or elements of a computing device. For example, the system 100 includes a processor 105, an eUSB2 device 110, an eUSB2 repeater 115, and a USB device 120. The USB device 120 is a legacy USB device, as described elsewhere herein. In some examples, one or both of the eUSB2 device 110 or the USB device 120 is implemented external to the system 100 and configured to couple to the system 100 through an appropriate interface (e.g., such as a port and receptacle suitable for performing communication according to eUSB2 or USB protocol, respectively). The processor 105 is, in some examples, a SoC. The eUSB2 device 110 is any device operating in both ingress and egress communication directions according to signal voltage level specifications for eUSB2. The USB device 120 is any device operating in both ingress and egress communication directions according to signal voltage level specifications for legacy USB. For example, in at least some implementations the USB device 120 is a peripheral such as a user input device, (e.g., a sensor, a scanner, an imaging device, a microphone, etc.), an output device (e.g., a printer, speakers, etc.), a storage device, or any other peripheral, component, or device suitable for communicating with the processor 105.

The eUSB2 repeater 115 communicatively couples the processor 105 to the USB device 120 and vice versa, converting signals appropriate for the processor 105 to signals appropriate for the USB device 120 and vice versa. For example, in some implementations signaling in the processor 105 is performed in a range of about 0.8 V to about 1.4 V. Similarly, in some implementations signaling in the USB device 120 is performed at about 3.3 V or about 5 V. In at least some examples, the eUSB2 repeater 115 operates as a bit-level repeater, receiving signals from one of the processor 105 or USB device 120 and converting the signals for use by the other of the processor 105 or USB device 120 (e.g., by shifting a voltage level of the signals upward or downward based on a direction of the communications). In some examples, a data signal in the system 100 ends with an EOP indicator. The EOP indicator is, in some examples, about 8 bits in length, in other examples is about 40 bits in length, and in yet other examples has any length defined according to USB or eUSB2 specifications. The EOP indicator is a static value. For example, a consistent series of logical high value bits or a consistent series of logical low value bits for a specified duration of the EOP indicator.

In at least some examples, after the eUSB2 repeater 115 receives the EOP indicator, eUSB2 differential input signal lines of the eUSB2 repeater 115 go to an idle state in which a differential voltage between the eUSB2 differential input signal lines is less than a predefined threshold, but is also, in at least some examples, non-zero. If the eUSB2 repeater 115 continues to amplify and transmit the signal received on the eUSB2 differential input signal lines out via the USB differential output signal lines, noise will be present on the USB differential output signal lines which is undesirable and/or unacceptable (e.g., such that the noise can degrade performance of a device receiving the noise). To prevent transmission of the noise, a transmitter 125 of the eUSB2 repeater 115 is turned off prior to a rising or falling transition at an end of the EOP indicator. USB specification, in at least some versions, prohibits truncation of the EOP indicator (e.g., ceasing transmission prior to transmitting a full bit width of the EOP indicator). Accordingly, in at least some examples the eUSB2 repeater 115 includes a comparator 130 that compares values present on each of the eUSB2 differential input signal lines to each other to determine when the rising or falling transition at the end of the EOP indicator occurs and, based on the result of that comparison, extends a last bit of the EOP indicator for up to four additional bits. During the period of time in which the EOP indicator is extended, the eUSB2 repeater 115 turns off the transmitter 125 to prevent noise from being transmitted out via the USB differential output signal lines following transmission of the EOP indicator, while also assuring an entire bit width of the EOP indicator is transmitted without truncation in compliance with USB specifications prior to the turning off of the transmitter 125. In at least some examples, these bits added to the end of the EOP indicator repeating the value of the last bit of the EOP indicator are referred to as EOP dribble or EOP dribble bits.

Figure 2:
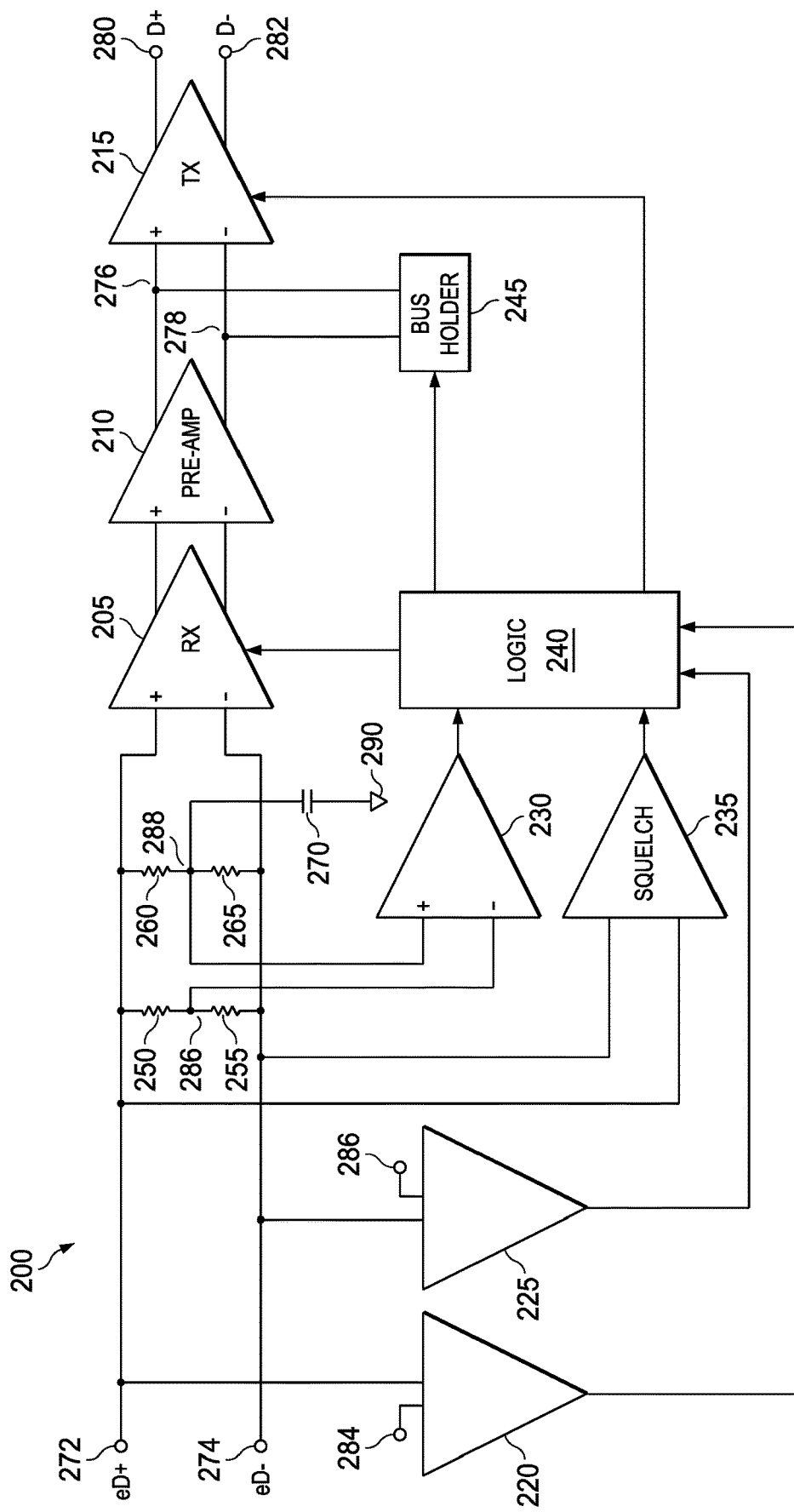
FIG. 2 shows a schematic diagram of an illustrative circuit in accordance with various examples.

Turning now to FIG. 2, a schematic diagram of an illustrative circuit 200 is shown. In at least some examples, the circuit 200 is suitable for implementation as the eUSB2 repeater 115 of the system 100 of FIG. 1. The circuit 200, in some examples, is representative of an eUSB2 repeater having functionality to receive data from an eUSB2 system and provide data to a legacy USB system. The circuit 200, in at least some examples, includes an amplifier 205, an amplifier 210, an amplifier 215, a comparator 220, a comparator 225, a comparator 230, a squelch detector 235, a logic circuit 240, a bus holder 245, a resistor 250, a resistor 255, a resistor 260, a resistor 265, and a capacitor 270. In at least some examples, the amplifier 205 is considered a receiver (RX) of the circuit 200, the amplifier 210 is considered a pre-amplifier (Pre-Amp) of the circuit 200, and the amplifier 215 is considered a transmitter (TX) of the circuit 200, for example, such that the amplifier 215 is representative of the transmitter 125 of the eUSB2 repeater 115. In at least some examples, the amplifier 210 is omitted from the circuit 200. In at least some examples, the comparator 230 is representative of the comparator 130 of the eUSB2 repeater 115. In at least some examples, the circuit 200 expressly does not include a CDR circuit or a PLL.

In an example architecture of the circuit 200, the amplifier 205 has a positive differential input coupled to a node 272 and a negative differential input coupled to a node 274. The amplifier 210 has a positive differential input coupled to a positive differential output of the amplifier 205 and a negative differential input coupled to negative differential output of the amplifier 205. The amplifier 210 also has a positive differential output coupled to a node 276 and a negative differential output coupled to a node 278. The amplifier 215 has a positive differential input coupled to the node 276, a negative differential input coupled to the node 278, a positive differential output coupled to a node 280, and a negative differential output coupled to a node 282. The comparator 220 has a first input coupled to the node 272 and a second input coupled to a node 284. The comparator 225 has a first input coupled to the node 274 and a second input coupled to a node 286. The comparator 230 has a first input coupled to a node 286 and a second input coupled to a node 288. The squelch detector 235 has a first input coupled to the node 272 and a second input coupled to the node 274. An output of the comparator 220, an output of the comparator 225, an output of the comparator 230, and an output of the squelch detector 235 are each coupled to respective inputs of the logic circuit 240. A first output of the logic circuit 240 is coupled to an offset control terminal of the amplifier 205, a second output of the logic circuit 240 is coupled to the bus holder 245, and a third output of the logic circuit 240 is coupled to a control terminal of the amplifier 215. The bus holder has a first output coupled to the node 276 and a second output coupled to the node 278. The resistor 250 is coupled between the node 272 and the node 286 and the resistor 255 is coupled between the node 286 and the node 274. The resistor 260 is coupled between the node 272 and the node 288 and the resistor 265 is coupled between the node 288 and the node 274. The capacitor 270 is coupled between the node 288 and a ground terminal 290.

In an example of operation of the circuit 200, a differential input signal is received at the node 272 and the node 274. For example, a positive component of the differential input signal (eD+) is received at the node 272 and a negative component of the differential input signal (eD−) is received at the node 274. In this regard, in at least some examples the node 272 and the node 274 collectively comprise eUSB2 differential input ports and/or eUSB2 differential input signal lines of the circuit 200. The amplifier 205 amplifies the differential input signal and the amplifier 210 amplifies a result of that amplification to provide signals at the node 276 and the node 278. In some examples, the amplifier 205 introduces an offset to the differential input signal based on control performed by the logic circuit 240 and according to a control signal received at the offset control terminal of the amplifier 205. For example, the logic circuit 240 controls the amplifier 205 to introduce an offset to the differential input signal such that the output of amplifier 205 will be a static logic high value or static logic low value based on a polarity of the offset. This, in some examples, at least partially facilitates the EOP extension taught herein and/or prevents the amplification of random noise in the output of the amplifier 205. The amplifier 215 amplifies the signals present at the node 276 and the node 278 to provide a differential output signal at the node 280 and the node 282, respectively. A positive component of the differential output signal (D+) is output at the node 280 and a negative component of the differential output signal (D−) is output at the node 282. In this regard, in at least some examples the node 280 and the node 282 collectively comprise USB differential output ports and/or USB differential output signal lines of the circuit 200. In at least some examples, the amplifier 215 is powered by a different power source and/or receives a different supply voltage than the amplifier 205, for example, such that the circuit 200 uses a dual-supply to provide level-shifting functionality between the eUSB2 differential input ports and the USB differential output ports. Additionally, in at least some examples the amplifier 215 is subject to control of the logic circuit 240. For example, the logic circuit 240 controls when the amplifier 215 is active, amplifying signals present at the node 276 and the node 278 to provide the differential output signal at the node 280 and the node 282, respectively, or when the amplifier 215 is turned off and is not amplifying signals present at the node 276 and the node 278 to provide the differential output signal at the node 280 and the node 282, respectively.

The comparator 220 is configured to compare eD+ to a first reference voltage (Vref1) received at the node 284 and output a result of the comparison to the logic circuit 240. The comparator 225 is configured to compare eD− to a second reference voltage (Vref2) received at the node 286 and output a result of the comparison to the logic circuit 240. In at least some examples, Vref1 and Vref2 are the same signal (e.g., such that the node 284 and the node 286 are coupled to a same, common point. In other examples, Vref1 and Vref2 are different signals but have substantially a same value. In yet other examples, Vref1 and Vref2 have different values. In at least some examples, one or both of the comparator 220 and/or the comparator 225 are replaced by a respective loss of signal detector (not shown) configured to determine whether loss of signal has occurred with respect to eD+ and/or eD−.

Each of the resistor 250, resistor 255, resistor 260, and resistor 265 have approximately a same resistance value such that they are balanced and a voltage present at the node 286 is approximately equal to common mode voltage (Vcm) of eD+ and eD−. Additionally, a center tap of eUSB2 differential signaling lines is floating, meaning the enter tap is not referenced to a ground potential. Accordingly, a voltage present at the node 288 is approximately equal to Vcm_ref based on Vcm and a voltage (Vc) of the capacitor 270. In at least some examples, the capacitor 270 has a capacitance of about 50 picofarads (pF) to create the floating center tap between eD+ and eD−. The comparator 230 is configured to compare Vcm to Vcm_ref to determine an edge transition of eD+. When the eUSB2 differential input signal lines are active, Vcm_ref charges to a value approximately equal to Vcm. When Vcm is greater than or approximately equal to Vcm_ref, the comparator 230 outputs a signal having a logical low value. When Vcm falls below Vcm_Vref, the comparator 230 outputs a signal having a logical high value. When the output of the comparator 230 transitions from a logical low level to a logical high level, the comparator 230 has detected an end of data receipt (e.g., such as an end of the EOP indicator and/or an eUSB2 input signal failure) and therefore the eUSB2 differential input signal lines going idle. The squelch detector 235, in at least some examples, outputs a logic high value signal when a differential between eD+ and eD− exceeds a threshold and outputs a logical low value signal when the differential between eD+ and eD− is less than the threshold. In at least some examples, the squelch detector 235 includes one or more noise and/or other filtering components that cause the squelch detector 235 to react slowly to changes in eD+ and eD−. For example, in at least some implementations a response time of the squelch detector 235 is insufficient (e.g., too slow) for the output of the squelch detector 235 to be used to identify an end of the EOP indicator and/or as a basis for control of the amplifier 215, as discussed herein, despite the output of the squelch detector 235 subsequently indicating the eUSB2 differential input signal lines going idle at a time subsequent to the end of the EOP indicator.

Based on the output of the comparator 230, the logic circuit 240 controls the bus holder 245 and/or the amplifier 215 to maintain a value of a last bit of the EOP indicator at the node 276 and the node 278 until after the amplifier 215 is turned off. In at least some examples, such control by the logic circuit 240 prevents noise resulting from idle eUSB2 differential input signal lines from being amplified and output by the amplifier 215 to the node 280 and/or the node 282. For example, when the comparator 230 indicates to the logic circuit 240 that data receipt via the eUSB2 differential input signal lines has ended, the logic circuit 240 determines, via the comparator 220 and the comparator 225, a state of each of the node 272 and the node 274. Based on the state of each of the node 272 and the node 274, the logic circuit 240 controls the bus holder 245 to maintain values of the node 276 and the node 278, respectively. For example, when the comparator 220 indicates that the node 272 is at a differential high level (e.g., Vcm plus one-half of a voltage swing of the differential input signal), the comparator 225 indicates that the node 274 is at a differential low level (e.g., Vcm minus one-half of the voltage swing of the differential input signal), and the comparator 230 outputs a logical high signal, the logic circuit 240 controls the bus holder 245 to hold the node 276 at the differential high level and hold the node 278 at the differential low level. Similarly, when the comparator 220 indicates that the node 272 is at the differential low level, the comparator 225 indicates that the node 274 is at the differential high, and the comparator 230 outputs a logical high signal, the logic circuit 240 controls the bus holder 245 to hold the node 276 at the differential low level and hold the node 278 at the differential high level. In at least some examples, the logic circuit 240 controls the bus holder 245 to hold the node 276 and the node 278 at the prescribed levels until the logic circuit 240 has controlled the amplifier 215 to turn off, after which the logic circuit 240 controls the bus holder 245 to release the node 276 and the node 278 to return to values determined according to a value of a signal received at the node 272 and the node 274, respectively.

In at least some examples, the bus holder 245 includes any one or more components suitable for, and configured to, selectively hold values of the node 276 and/or the node 278 at desired levels when controlled by the logic circuit 240 and release the nodes 276 and/or 278 when controlled by the logic circuit 240. In some example implementations, the bus holder 245 holds the node 276 and/or the node 278 at the desired levels when controlled by the logic circuit 240 by shorting a source voltage or a ground terminal to the node 276 and/or the node 278, and accordingly to respective inputs of the amplifier 215. In some examples, the bus holder 245 inverts a polarity of a signal present at the node 276 and/or the node 278 and in other examples the bus holder 245 maintains or holds a polarity of the signal present at the node 276 and/or the node 278.

Figure 3:
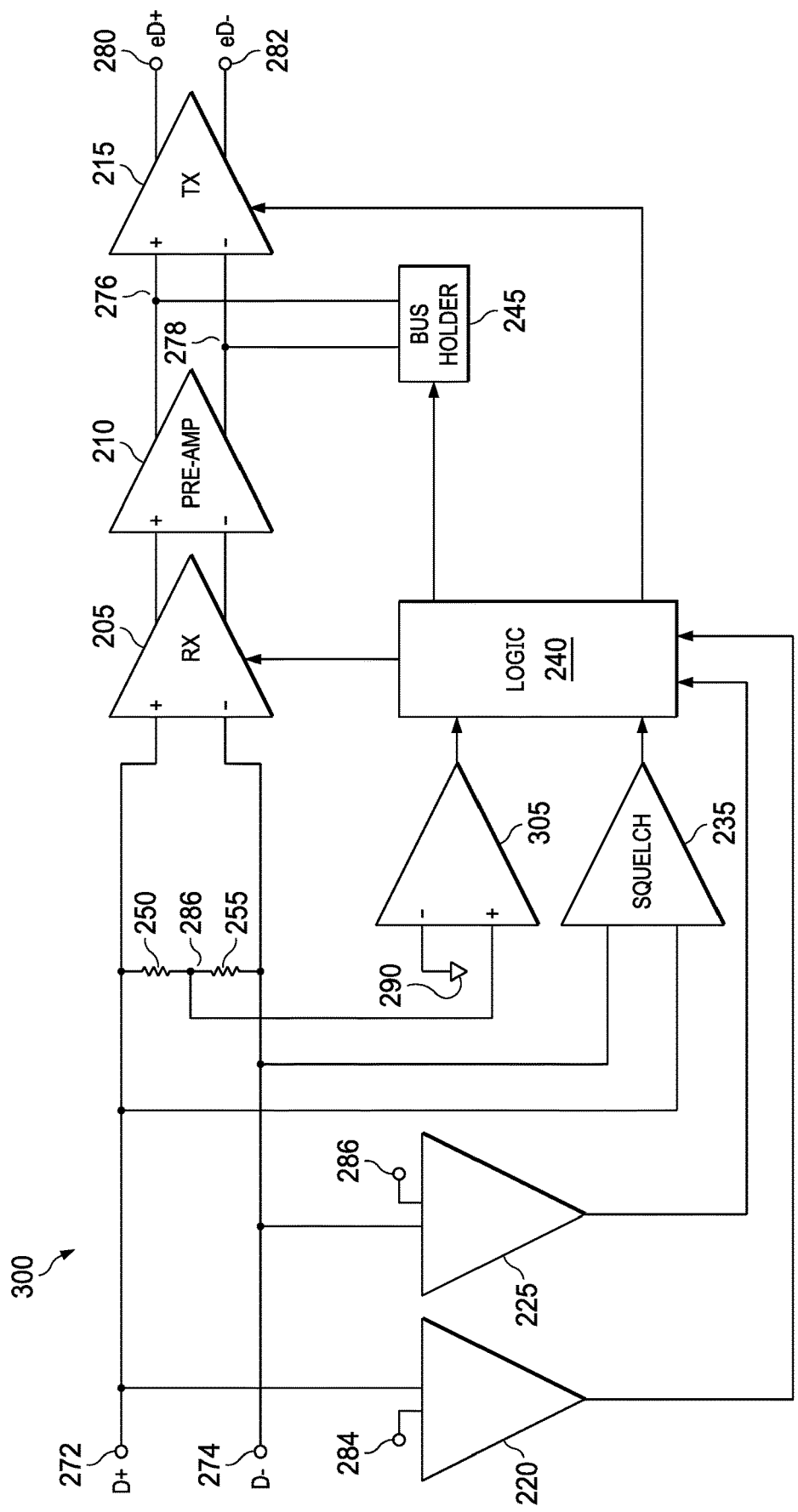
FIG. 3 shows a schematic diagram of an illustrative circuit in accordance with various examples.

Turning now to FIG. 3, a schematic diagram of an illustrative circuit 300 is shown. In at least some examples, the circuit 300 is suitable for implementation as the eUSB2 repeater 115 of the system 100 of FIG. 1. The circuit 300, in at least some examples, includes the amplifier 205, the amplifier 210, the amplifier 215, the comparator 220, the comparator 225, a comparator 305, the squelch detector 235, the logic circuit 240, the bus holder 245, the resistor 250, and the resistor 255. The circuit 300, in some examples, is representative of an eUSB2 repeater having functionality to receive data from a legacy USB system and provide data to an eUSB2 system. In at least some examples, the comparator 305 is representative of the comparator 130 of the eUSB2 repeater 115. In at least some examples, the circuit 300 expressly does not include a CDR circuit or a PLL.

In an example architecture of the circuit 300, the components are coupled as described above with respect to the circuit 200 of FIG. 2 and the description of which is not repeated herein. In at least one example, the comparator 305 has a first input coupled to the node 286, a second input coupled to the ground terminal 290, and an output coupled to the logic circuit 240.

In at least one example of operation, components of the circuit 300 having like reference numerals to those of the circuit 200 operate in substantially the same manner as discussed above with respect to the circuit 200. Additionally, in understanding the operation of the circuit 300, where reference was made to eD+ and eD− in describing the circuit 200, reference is instead made to D+ and D− in describing the circuit 300. Where reference was made to D+ and D− in describing the circuit 200, reference is instead made to eD+ and eD− in describing the circuit 300. For example, whereas the circuit 200 received eD+ and eD− at the node 272 and the node 274, respectively, and output D+ and D− at the node 280 and the node 282, respectively, the circuit 300 receives D+ at the node 272, receives D− at the node 274, outputs eD+ at the node 280, and outputs eD− at the node 282.

The comparator 305 is configured to compare Vcm to a signal present at the ground terminal (e.g., such as a ground potential) and output a logical high signal when Vcm is greater the signal present at the ground terminal to determine an edge transition of D+. As discussed above with respect to the circuit 200, the center tap of eUSB2 differential signaling lines is floating such that the second input of the comparator 230 is coupled to the node 288 instead of the ground terminal. In contrast, a center tap of legacy USB differential signaling lines is grounded (e.g., coupled to the ground terminal 290). Accordingly, the second input of the comparator 305 is also coupled to the ground terminal 290. When the output of the comparator 305 transitions from a logical low level to a logical high level, the comparator 305 has detected an end of data receipt (e.g., such as an end of the EOP indicator and/or an USB input signal failure) and therefore the USB differential input signal lines going idle. The logic circuit 240 controls the amplifier 215 and the bus holder 245 based on the output of the comparator 305 in substantially the same manner as described above with respect to the output of the comparator 230.

Figure 4:
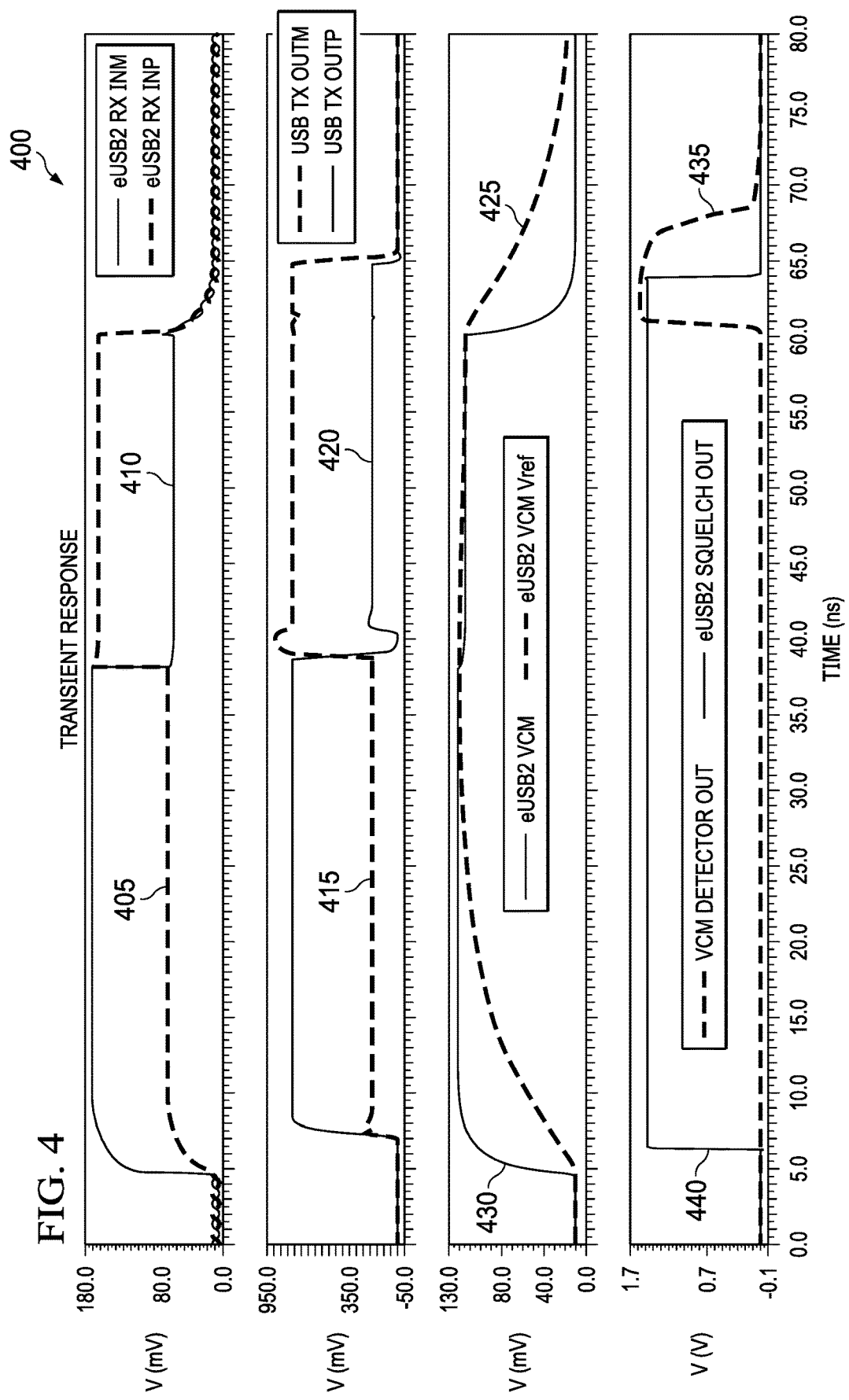
FIG. 4 shows a diagram of illustrative signals in accordance with various examples.

Turning now to FIG. 4, a diagram 400 of illustrative waveforms is shown. The diagram 400 illustrates a waveform 405, a waveform 410, a waveform 415, a waveform 420, a waveform 425, a waveform 430, a waveform 435, and a waveform 440. In some examples, such as when the diagram 400 is representative of waveforms present in the circuit 200, the waveform 405 corresponds to eD+, the waveform 410 corresponds to eD−, the waveform 415 corresponds to D+, the waveform 420 corresponds to D−, the waveform 425 corresponds to Vcm_Vref, the waveform 430 corresponds to Vcm, the waveform 435 corresponds to the output of the comparator 230, and the waveform 440 corresponds to the output of the squelch detector 235. In other examples, such as when the diagram 400 is representative of waveforms present in the circuit 300, the waveform 405 corresponds to D+, the waveform 410 corresponds to D−, the waveform 415 corresponds to eD+, the waveform 420 corresponds to eD−, the waveform 425 is omitted (e.g., such that Vcm_ref is not present in the circuit 300), the waveform 430 corresponds to Vcm, the waveform 435 corresponds to the output of the comparator 305, and the waveform 440 corresponds to the output of the squelch detector 235.

As illustrated in FIG. 4 and described throughout the present disclosure, when a falling edge occurs in the waveform 405 at time t1 such that a differential voltage between the waveform 405 and the waveform 410 is less than a threshold amount, an end of receipt of differential data is determined and the waveform 430 begins decreasing in value. When the waveform 430 decreases in value, a rising edge occurs in the waveform 435. Based on the rising edge occurring in the waveform 435, the waveform 415 is controlled to maintain a value present at the time t1 until a time t2, at which transmission is turned off and the waveform 415 and the waveform 420 are pulled to a ground potential. Additionally, as shown by the waveform 435 and the waveform 440, the falling edge of the waveform 440 trails time t1, occuringly slightly before time t2, and is therefore insufficient as detection result for use in controlling the extension of the value of the waveform 415 at the time t1 until the time t2.

Figure 5:
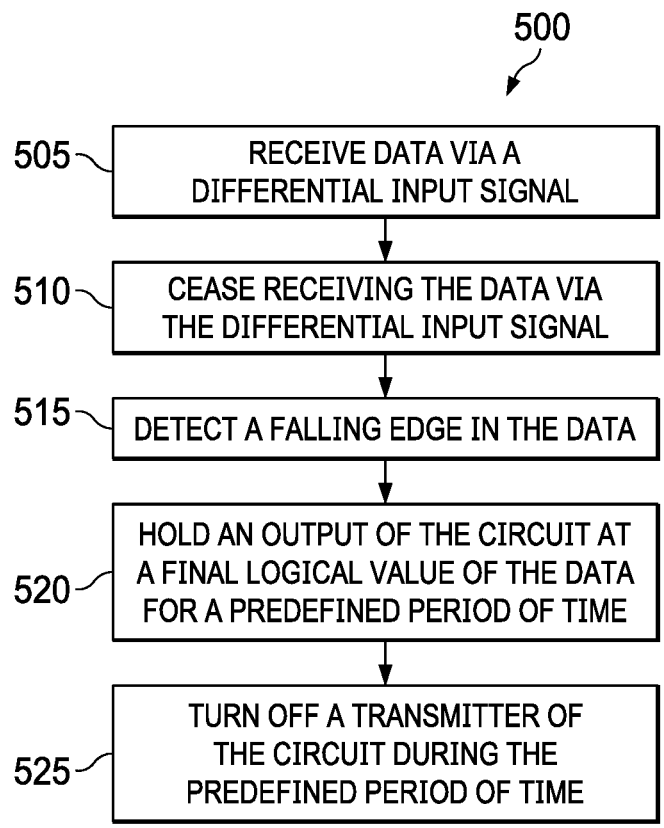
FIG. 5 shows a flowchart of an illustrative method in accordance with various examples.

Turning now to FIG. 5, a flowchart of an illustrative method 500 is shown. In at least some examples, the method 500 corresponds to actions performed by one or more components of the system 100, circuit 200 and/or the circuit 300. The method 500 is, in some examples, a method for controlling a transmitter of a circuit, such as a transmitter of an eUSB2 repeater. Implementation of the method 500 by a circuit, in at least some examples, is advantageous in preventing transmission of noise by the circuit when differential input lines of the circuit go idle (e.g., have a floating and, at least sometimes, non-zero value) without the use of a CDR circuit or PLL.

At operation 505, data is received via a differential input signal. In some examples, such as when the differential signal is received according to eUSB2 signaling protocols, a center tap of the differential input signal is floating. In other examples, such as when the differential signal is received according to legacy USB protocols, the center tap of the differential input signal is grounded. When data is being received via the differential input signal (e.g., when a magnitude of the differential input signal is much higher than 0), differential signaling lines carrying the differential input signal are considered to be active. Conversely, when data is not being received (e.g., when the magnitude of the differential input signal is about 0, or both positive and negative components of the differential input signal have approximately the same value), the differential signaling lines carrying the differential input signal are considered to be inactive or idle. Furthermore, when both positive and negative components of the differential input signal are pulled low to a ground potential, the differential signaling lines carrying the differential input signal are considered to be in a high-speed idle state.

At operation 510, the data ceases to be received via the differential input signal. When data is not received via the differential signal, the differential signaling lines are considered to be idle, where particular values of the differential input signal are undefined. In at least some examples, the differential signaling lines being idle is defined as a differential between positive and negative components of the differential input signal being less than a predefined threshold.

At operation 515, a falling edge in the data is detected. The falling edge, in some examples, occurs at an end to receipt of data via the differential input signal and/or the differential signaling lines transitioning to an idle state. In such examples, the falling edge causes a differential voltage between a positive component of the differential input signal and a negative component of the differential input signal to be less than a threshold amount, indicating the end to receipt of data via the differential input signal and/or the differential signaling lines transitioning to an idle state. The falling edge is, in some examples, present in a positive component of the differential input signal. In other examples, the falling edge is present in a negative component of the differential input signal. When a falling edge occurs in one, or both, of the positive component of the differential input signal and/or the negative component of the differential input signal, but the differential voltage between the positive component of the differential input signal and the negative component of the differential input signal is not less than the threshold amount, the differential signaling lines are not considered to be idle. In at least some examples, the falling edge is detected by comparing a common mode voltage of the differential input signal to a reference voltage. In some examples, such as when the data is received from an eUSB2 system, the reference voltage is Vcm_ref. In other examples, such as when the data is received from a legacy USB system, the reference voltage is a ground potential. The comparison is performed, in at least some examples, by a comparator.

At operation 520, an output of the circuit is held at a final logical value of the data. The final logical value of the data is, for example, the logical value represented by the data immediately prior to the falling edge in the data. The final logical value of the data is determined according to any suitable means, the scope of which is not limited by the method 500. The output of the circuit is held at the final logical value for a predefined period of time. In various examples, the predefined period of time ranges from 0 bits to 4 bits. For example, when the final value of the data was representative of a logical 1 and the falling edge in the data is detected, customarily an output of the transmitter would also include a falling edge reflective of, and corresponding to, the falling edge in the data, such that a logical 1 is no longer output by the transmitter. Conversely, at operation 520 the transmitter continues to output the logical 1 to hold the output of the circuit for the predefined period of time. Similarly, when the final value of the data was representative of a logical 0 and the falling edge in the data is detected, customarily an output of the transmitter would also include a falling edge reflective of, and corresponding to, the falling edge in the data, such that a logical 0 is no longer output by the transmitter. Conversely, at operation 520 the transmitter continues to output the logical 0 to hold the output of the circuit for the predefined period of time.

The output of the circuit is held at the final logical value, in at least some examples, by controlling input nodes of the transmitter to have values representative of a logical 1 or a logical 0 irrespective of a value of the differential input signal received at that point in time. For example, when the individual components of the differential input signal prior to the falling edge in the data values representative of a logical 1, the input nodes of the transmitter are held at the values representative of the logical 1 even after the differential input signal goes idle. When the individual components of the differential input signal prior to the falling edge in the data values representative of a logical 0, the input nodes of the transmitter are held at the values representative of the logical 0 even after the differential input signal goes idle. The input nodes of the transmitter are held at the final logical value, in some example, by controlling one or more switches (such as components of a bus holder circuit) to couple, or decouple, the input nodes of the transmitter to, or from, one or more voltage sources having values configured to represent the logical 1 and/or the logical 0. The control of the switches is performed, in at least some examples, based on a result of the detection of the falling edge. In at least some examples in which the falling edge of the data was a falling edge (e.g., a final transition) of an EOP indicator of a USB packet, holding the final logical value of the data introduces EOP dribble to the circuit and a width of the EOP dribble (e.g., the predetermined period of time and/or a number of bits of the EOP dribble) is subject to eUSB2 and/or USB specifications.

At operation 525, the transmitter is turned off or disabled during the predefined period of time. The transmitter is turned off during the predefined period of time, in at least some examples, to prevent transmission of values received via the differential input signal after the differential input signal has gone idle. Accordingly, in at least some examples, turning off the transmitter during the predefined period of time prevents the transmission of noise by the transmitter between the falling edge of the data and turning off of the transmitter. In at least some examples, the operation 525 is performed consecutively with the operation 520 (e.g., such that while the final logical value of the data is being held according to operation 520, operation 525 is performed to turn off the transmitter). In at least some examples, after turning off the transmitter, the input nodes of the transmitter are released (e.g., the final logical value of the data is no longer held) such that the input nodes of the transmitter track, either linearly or non-linearly, the differential input signal.

While the operations of the method 500 have been discussed and labeled with numerical reference, in various examples the method 500 includes additional operations that are not recited herein (e.g., such as intermediary comparisons, logical operations, output selections such as via a multiplexer, etc.), in some examples any one or more of the operations recited herein include one or more sub-operations (e.g., such as intermediary comparisons, logical operations, output selections such as via a multiplexer, etc.), in some examples any one or more of the operations recited herein is omitted, and/or in some examples any one or more of the operations recited herein is performed in an order other than that presented herein (e.g., in a reverse order, substantially simultaneously, overlapping, etc.), all of which is intended to fall within the scope of the present disclosure.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., field effect transistor (FET), metal oxide semiconductor FET (MOSFET), n-type, p-type, drain-extended, natural, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
a first amplifier having a first input coupled to a first node, a second input coupled to a second node, a first output, and a second output;
a second amplifier having a first input coupled to the first output of the first amplifier, a second input coupled to the second output of the first amplifier, a first output coupled to a third node, and a second output coupled to a fourth node;
a third amplifier having a first input coupled to the third node, a second input coupled to the fourth node, a first output coupled to a fifth node, a second output coupled to a sixth node, and a control input;
a first resistor coupled between the first node and a seventh node;
a second resistor coupled between the seventh node and the second node; and
a first comparator having a first input coupled to the seventh node, a second input coupled to an eighth node, and an output.

* * * * *